(12) United States Patent
Agrawal

(10) Patent No.: US 6,438,046 B1
(45) Date of Patent: Aug. 20, 2002

(54) SYSTEM AND METHOD FOR PROVIDING ROW REDUNDANCY WITH NO TIMING PENALTY FOR BUILT-IN-SELF-REPAIR (BISR) IN HIGH DENSITY MEMORIES

(75) Inventor: Ghasi R. Agrawal, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/907,202

(22) Filed: Jul. 17, 2001

(51) Int. Cl.⁷ .................................................. G11C 7/00

(52) U.S. Cl. .................................. 365/200; 365/230.06

(58) Field of Search ............................... 365/200, 201, 365/230.06, 230.08, 230.03, 225.7, 230.02

(56) References Cited

U.S. PATENT DOCUMENTS

| | | | |
|---|---|---|---|
| 5,134,584 A | * 7/1992 | Boler et al. | 365/200 |
| 5,539,698 A | * 7/1996 | Suzuki | 365/200 |
| 5,889,712 A | * 3/1999 | Sugibayashi | 365/200 |
| 6,104,648 A | * 8/2000 | Ooishi | 365/200 |
| 6,246,631 B1 | * 6/2001 | Park | 365/230.06 |

* cited by examiner

Primary Examiner—Hoai Ho
Assistant Examiner—Gene N. Auduong
(74) Attorney, Agent, or Firm—Suiter & Associates PC

(57) ABSTRACT

A system and method for providing row redundancy for BISR of high density memory arrays without a timing penalty decreases capacitance of the memory array bitlines at least during accessing of rows of redundant memory of a memory array. In this manner, the amount of time required to access the redundant memory is limited so that no timing penalty is incurred by the memory.

29 Claims, 1 Drawing Sheet

SYSTEM AND METHOD FOR PROVIDING ROW REDUNDANCY WITH NO TIMING PENALTY FOR BUILT-IN-SELF-REPAIR (BISR) IN HIGH DENSITY MEMORIES

FIELD OF THE INVENTION

The present invention relates generally to Built-In-Self-Repair (BISR) techniques utilized for testing and repair of high density memory arrays of Intelligent Random Access Memories (IRAM), Dynamic Random Access Memories (DRAM) and the like, and more specifically to a system and method for providing row redundancy for BISR for such high density arrays.

BACKGROUND OF THE INVENTION

Built-In-Self-Repair (BISR) techniques are increasingly being used to test and repair high density memory arrays of Intelligent Random Access Memories (IRAM), Dynamic Random Access Memories (DRAM), and the like. BISR utilizes on-chip circuitry for automatically testing the memory array, and optionally performing a soft-repair of failed elements (rows, columns, I/Os, etc.) of the memory array discovered during test. Without BISR such high density memories would not yield well resulting in increased cost for their manufacture.

BISR uses Built-In-Self-Test (BIST) to test the memory elements and store the address of the defective element (e.g., row, column, input/output (I/O), or the like). BISR then remaps the defective elements using available redundant elements of the memory and stores the repair solution (i.e., the addresses of defective elements and the addresses of redundant elements of the memory array to which the defective elements have been remapped) in soft latches at least during the initial check of the memory. Next, BISR again runs BIST to verify the repair.

Typically, row redundancy schemes employed by BISR utilize a remap circuit that compares the incoming address provided by BIST with the stored defective address. If matched, corresponding redundant row address is activated and the defective row is disabled. Typically, defective rows are disabled using one of two methods. In accordance with the first method, defective rows are disabled "on the fly" (i.e. the regular memory word line is disabled when the redundant row address is activated). However, this method requires that the user address be set well in advance so that the comparison may be performed and the defective row disabled, thereby increasing the address setup time. The second method utilizes latches, or, alternately fuses at each row for disabling the row if it is found to be defective. Defective rows are then disabled at the start of the memory power-up by setting the appropriate latches, or, alternately, blowing the appropriate fuses.

The first method, disabling defective rows on the fly, increases address setup time resulting in an address setup penalty, often of as much as 1 to 2 ns, and is thus generally not acceptable for use in most memory designs. Thus, the second approach, disabling defective rows during memory power-up, is normally preferred since it does not increase address setup time. However, the time required to perform a remap of defective row elements may often increase the access time significantly, resulting in a substantial timing penalty. Moreover, innovations in memory circuit design have shortened memory access times, thus reducing time available in which to perform the remap. Thus, for BISR to perform a remap of defective row elements the following equation (Equation 1) must be satisfied:

$$CLK\_WL_{NA} + WL\_Dout_{NA} = CLK\_WLR_{RA} + WLR\_Dout_{RRA} \quad \text{(Equation 1)}$$

where $CLK\_WL_{NA}$ is the delay from clock activation to the normal word line turning on through normal address, $WL\_Dout_{NA}$ is the time required for the normal word line to turn on ("ON") to data out, $CLK\_WLR_{RA}$ is the delay from clock activation to redundant word line turning on ("ON"), and $WLR\_Dout_{RRA}$ is the time required for the redundant row to turn on ("ON") to data out. Because setup of the normal (system) address is performed at the same time as it would be without BISR, the time $CLK\_WLR_{RRA}$ also includes time required to perform the remap (which depends on remap logic). Thus, the time represented by the right side of Equation 1 ($CLK\_WLR_{RA} + WLR\_Dout_{RRA}$) may be larger then the time represented by the left side ($CLK\_WL_{NA} + WL\_Dout_{NA}$) resulting in an access time penalty.

Consequently, it would be advantageous to provide row redundancy for BISR of high density arrays without a timing penalty.

SUMMARY OF THE INVENTION

Accordingly, the present invention is directed to a system and method for providing row redundancy for BISR of high density memory arrays without a timing penalty by decreasing capacitance of the memory array bitlines at least during accessing of rows of redundant memory of a memory array. In this manner, the amount of time required to access the redundant memory is limited so that no timing penalty is incurred by the memory.

In one embodiment, the memory is comprised of a memory array segregated into a plurality of rows including at least one row of redundant memory accessed by a bitline for transfer of data. A decoupler decouples the redundant memory from regular memory of the memory array shortening the bitline for decreasing capacitance of the bitline at least during accessing of the at least one row of redundant memory thus limiting the amount of time required to access the redundant memory so that no timing penalty is incurred.

In a second embodiment, the memory is comprised of a memory array segregated into a plurality of rows including at least one row of redundant memory accessed by a bitline for transfer of data from regular rows of the memory array. A second bitline is arranged in parallel with the first bitline for accessing rows of the redundant memory. The first bitline is connected to an input/output controller during access of regular memory of the memory array while the second bitline is connected to the input/output controller during access of the at least one row of redundant memory thereby reducing capacitance in both bitlines. In this manner, the amount of time required to access the redundant memory is limited so that no timing penalty is incurred.

It is to be understood that both the foregoing general description and the following detailed description are exemplary and explanatory only and are not restrictive of the invention as claimed. The accompanying drawings, which are incorporated in and constitute a part of the specification, illustrate presently preferred embodiments of the invention, and together with the general description given above and the detailed description of the preferred embodiments given below, serve to explain the principles of the invention.

BRIEF DESCRIPTION OF THE DRAWINGS

The detailed description of the invention may be best understood when read in reference to the accompanying drawings wherein.

DETAILED DESCRIPTION OF THE INVENTION

The present invention provides a system and method for providing row redundancy for BISR of high density memory arrays, wherein the time of memory access is reduced when redundant memory rows are accessed. In this manner, dependence of the design of the remap logic is greatly reduced. Thus, a software implementation may be utilized for remap of defective memory rows, while still allowing the required access time of the memory to be met through the use of redundant rows utilizing standard logic gates in an RTL (Resistor Transistor Logic) implementation. Reference will now be made in detail to the presently preferred embodiments of the invention, an examples of which are illustrated in the accompanying drawings.

Figure 1:
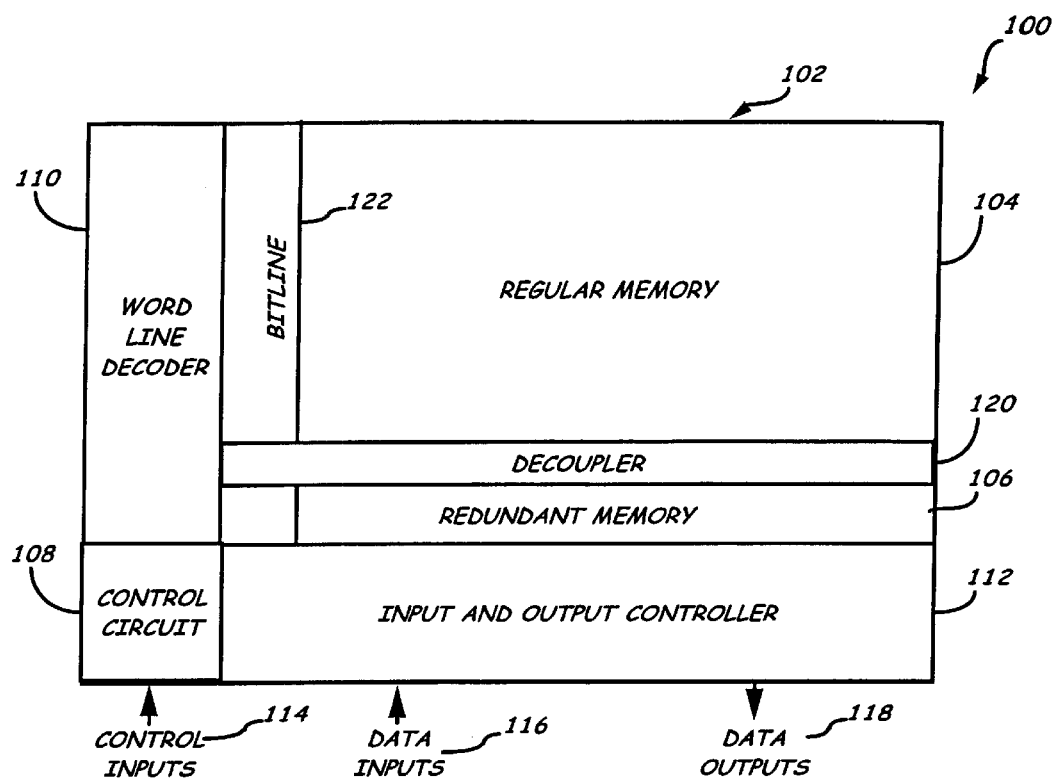
FIG. 1 is a block diagram illustrating a high density memory having a decoupler for isolating the redundant memory bitline from the regular memory bitline in accordance with an exemplary embodiment of the present invention.

FIG. 1 illustrates a high density memory having a decoupler for isolating the redundant memory bitline from the regular memory bitline in accordance with an exemplary embodiment of the present invention. Memory 100 is comprised of an array of memory cells 102 arranged in a plurality of rows comprising regular memory rows ("REGULAR MEMORY") 104 and redundant memory rows ("REDUNDANT MEMORY") 106. Writing of data to and reading of data from the memory cell array 102 is managed by control circuit 108, word line decoder 110, and input/output controller or circuit 112. Control circuit 108 receives control input signals (e.g., Address, Clock and Write Enable signals) 114 which are decoded and used to provide signals for controlling word line decoder 110 and input/output controller 112. Input/output controller 112 further receives data input signals 116 and generates data output signals 118. Word line decoder 110 and input/output controller 112 in turn control reading and writing of data in memory cell array 102. In accordance with the present invention, a disabling mechanism such as a latch, a fuse, or the like, is provided at least at each row of regular memory 102 for disabling rows found to be defective by BIST.

In the exemplary embodiments of the invention, as shown in FIG. 1, rows of redundant memory 106 are placed between rows of regular memory 104 and sense amplifiers of input/output controller 112. Decoupler 120 is provided between redundant memory 106 and regular memory 104 for decoupling the regular memory 104 from the redundant memory 106 and input/output controller 112 during access of rows of redundant memory 106. In this manner, bitline 122 is shortened and the capacitance of bitline 122 is substantially lowered. By lessening bitline capacitance the access time during redundant memory access may be reduced. Thus, referring again to Equation 1, decreasing the bitline capacitance and thus access time during redundant memory access reduces the duration of WLR_Dout$_{RRA}$ allowing both sides of the equation to be balanced so that any timing penalty due to redundancy is eliminated. In exemplary embodiments, decoupler 120 is activated to decouple regular memory 102 from redundant memory 104 and input/output controller 112 when the address of a row of redundant memory 104 is activated. During access of rows of regular memory 102, decoupler 120 is deactivated so that the bitlines of regular memory 104 may be coupled to input/output controller 112.

Figure 2:
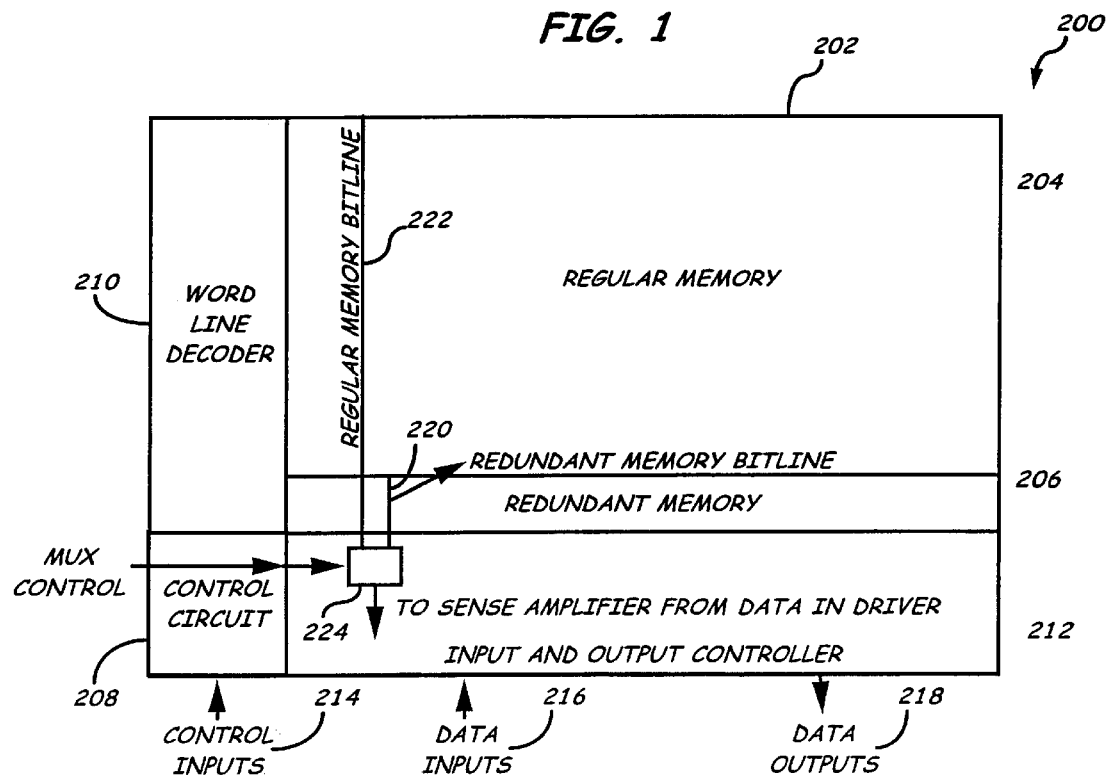
FIG. 2 is a block diagram illustrating a high density memory having an architecture comprised of parallel redundant and regular memory bitlines in accordance with a second exemplary embodiment of the present invention.

Referring now to FIG. 2, a high density memory having an architecture comprised of parallel redundant and regular memory bitlines in accordance with a second exemplary embodiment of the present invention is described. Like the memory 100 of FIG. 1, high density memory 200 is comprised of an array of memory cells 202 arranged in a plurality of rows comprising regular memory rows ("REGULAR MEMORY") 204 and redundant memory rows ("REDUNDANT MEMORY") 206. Writing of data to and reading of data from the memory cell array 202 is managed by control circuitry 208, word line decoder 210, and input/output controller or circuit 212. Control circuit 208 receives control input signals (e.g., Address, Clock and Write Enable signals) 214 which are decoded and used to provide signals for controlling word line decoder 210 and input/output controller 212. Input/output controller 212 further receives data input signals 216 and generates data output signals 218. Word line decoder 210 and input/output controller 212 in turn control reading and writing of data in memory cell array 202. Again, a disabling mechanism such as a latch, a fuse, or the like, is provided at least at each row of regular memory 204 for disabling rows found to be defective by BIST.

As shown in FIG. 2, a parallel bitline 220 is provided for redundant memory 206. Preferably, bitline 220 is multiplexed with the bitline 222 for regular memory 204 via multiplexors 224. During access of the rows of regular memory 204, multiplexors 224 corresponding to bitline 222 of regular memory 204 are turned on ("ON") connecting the bitlines 222 to input/output controller 212, while multiplexors 224 corresponding to bitline 220 of redundant memory 206 may be off ("OFF") so that bitline 220 is not connected. However, when rows of redundant memory 206 are accessed (i.e., when addresses of rows of redundant memory 206 are activated), multiplexors 224 corresponding to bitline 220 of redundant memory 206 are turned on ("ON") connecting bitline 220 to input/output controller 212, while multiplexors 224 corresponding to bitline 222 of regular memory 204 are turned off ("OFF") so that bitline 222 is not connected. In this manner, the effective bitline capacitance is substantially lowered by using a separate bitline 220 for redundant memory rows 206 which will have very small capacitance, allowing the access time during redundant memory access to be reduced. Thus, referring again to Equation 1, decreasing the bitline capacitance, and thus access time during redundant memory access, substantially reduces the duration of WLR_Dout$_{RRA}$ allowing both sides of the equation to be balanced so that any timing penalty due to redundancy is eliminated. Additionally, by utilizing redundant bitline 220 to connect rows of redundant memory 206, no timing penalty for decoupling the bitline 222 of regular memory 204 is incurred.

Multiplexors 224 may operate on top of multiplexors commonly utilized in such memories for multiplexing different numbers of words in a common row. For example, in a memory having 1024 words and 32 bits, a 4:1 column multiplex would have 256 physical rows (i.e., 4 words in each row) and 128 physical columns (i.e., 32 I/Os). Multiplexors 224 disable all 4 words of regular memory 204 when rows of redundant memory 206 are accessed (i.e., when addresses of rows of redundant memory 206 are activated), allowing one word from redundant memory 206. Similarly, additional multiplexors may be provided for disabling the four (4) redundant words, thus allowing only one word from regular memory 204 when no redundant address is activated.

In this manner, multiplexor 224 functions as a parallel multiplexor to the regular multiplexor of memory 200, adding no additional delay.

The memories 100 & 200 described herein in FIGS. 1 and 2 produce no timing penalty (for address setup time or access time) while allowing row redundancy scheme to be utilized for BISR. Since row redundancy is more easily implemented (e.g., using an RTL-type remap circuit), the overall flow is significantly simplified. In this manner, the present invention allows row redundancy to be implemented in memory technologies having very small access times and cycle times.

The present invention has been described in exemplary embodiments as being implemented by single-port memories 100 & 200. However, it is contemplated that the present invention may be applied to any memory which requires a redundancy scheme (e.g., multi-port memories, or the like). Thus, it will be appreciated that the architectures of memories 100 & 200 shown in FIGS. 1 and 2 and described herein, are exemplary and not exhaustive of all memory architectures that may employ the present invention. Thus, the basic memory architectures shown in FIGS. 1 and 2, may be varied significantly depending on design requirements. Accordingly, it is believed that modification of the memory architectures by those of ordinary skill in the art while retaining the any or all of the functions provided by the present invention would not depart from the scope and spirit of the present invention as defined in the appended claims.

It is believed that the present invention and many of its attendant advantages will be understood by the forgoing description, and it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. A system for providing row redundancy for BISR of a memory array, comprising:
   a memory array segregated into a plurality of rows, the memory array including at least one row of redundant memory;
   a bitline for accessing specific rows of the memory array; and
   a decoupler for decoupling the redundant memory from regular memory of the memory array during accessing of the at least one row of redundant memory for decreasing capacitance of the bitline at least during accessing of the at least one row of redundant memory, wherein an amount of time required to access the at least one row of redundant memory is limited by reducing the capacitance of the bitline so that no timing penalty is incurred by the memory.

2. The system as claimed in claim 1, wherein the decoupler is activated to decouple the at least one row of redundant memory from regular memory of the memory array when an address of the at least one row of redundant memory is activated.

3. The system as claimed in claim 1, further comprising an input/output controller, the decoupler being suitable for decoupling the at least one row of redundant memory from the input/output controller.

4. The system as claimed in claim 3, wherein the decoupler is activated to decouple the at least one row of redundant memory from regular memory of the memory array and from the input/output controller when an address of the at least one row of redundant memory is activated.

5. The system as claimed in claim 1, wherein the decoupler is deactivated during access of regular memory of the memory array.

6. A method for providing row redundancy for BISR of a memory array, comprising:
   accessing a memory array segregated into a plurality of rows, the memory array including at least one row of redundant memory and a bitline for accessing specific rows of the memory array; and
   decoupling the at least one row of redundant memory from regular memory of the memory array during accessing of the at least one row of redundant memory for decreasing capacitance of the bitline at least during accessing of the at least one row of redundant memory, wherein an amount of time required to access the at least one row of redundant memory is limited by reducing the capacitance of the bitline so that no timing penalty is incurred by the memory.

7. The method as claimed in claim 6, wherein the at least one row of redundant memory is decoupled from regular memory of the memory array when an address of the at least one row of redundant memory is activated.

8. The method as claimed in claim 6, further comprising decoupling the at least one row of redundant memory from an input/output controller of the memory array.

9. The method as claimed in claim 8, wherein the at least one row of redundant memory is decoupled from regular memory of the memory array and from the input/output controller of the memory array when an address of the at least one row of redundant memory is activated.

10. A memory, comprising:
    a memory array segregated into a plurality of rows, the memory array including at least one row of redundant memory;
    a bitline for accessing specific rows of the memory array; and
    a decoupler for decoupling the at least one row of redundant memory from regular memory of the memory array during accessing of the at least one row of redundant memory for decreasing capacitance of the bitline at least during accessing of the at least one row of redundant memory,
    wherein reducing the capacitance of the bitline reduces the amount of time required to access the at least one row of redundant memory.

11. The memory as claimed in claim 10, comprising at least one of a latch and a fuse provided at each row of the memory array for disabling the row if it is determined to be defective.

12. The memory as claimed in claim 10, wherein the decoupler is activated to decouple the at least one row of redundant memory from regular memory of the memory array when an address of the at least one row of redundant memory is activated.

13. The memory as claimed in claim 10, further comprising an input/output controller, the decoupler being suitable for decoupling the at least one row of redundant memory from the input/output controller.

14. The memory as claimed in claim 13, wherein the decoupler is activated to decouple the at least one row of redundant memory from regular memory of the memory array and from the input/output controller when an address of the at least one row of redundant memory is activated.

15. The memory as claimed in claim 10, wherein the decoupler is deactivated during access of regular memory of the memory array.

16. A memory, comprising:
   a memory array segregated into a plurality of rows, the memory array including at least one row of redundant memory;
   a bitline for accessing specific rows of the memory array; and
   a decoupler for decoupling the redundant memory from regular memory of the memory array for decreasing capacitance of the bitline at least during accessing of the at least one row of redundant memory,
      wherein an amount of time required to access the at least one row of redundant memory is limited by reducing the capacitance of the bitline so that no timing penalty is incurred by the memory.

17. The memory as claimed in claim 16, wherein the decoupler is activated to decouple the at least one row of redundant memory from regular memory of the memory array when an address of the at least one row of redundant memory is activated.

18. The memory as claimed in claim 16, further comprising an input/output controller, the decoupler being suitable for decoupling the at least one row of redundant memory from the input/output controller.

19. The memory as claimed in claim 18, wherein the decoupler is activated to decouple the at least one row of redundant memory from regular memory of the memory array and from the input/output controller when an address of the at least one row of redundant memory is activated.

20. The memory as claimed in claim 16, wherein the decoupler is deactivated during access of regular memory of the memory array.

21. The system as claimed in claim 20, wherein the decoupler is activated to decouple the at least one row of redundant memory from regular memory of the memory array when an address of the at least one row of redundant memory is activated.

22. The system as claimed in claim 21, wherein the decoupler is activated to decouple the at least one row of redundant memory from regular memory of the memory array and from the input/output controller when an address of the at least one row of redundant memory is activated.

23. The system as claimed in claim 20, further comprising an input/output controller, the decoupler being suitable for decoupling the at least one row of redundant memory from the input/output controller.

24. The system as claimed in claim 20, wherein the decoupler is deactivated during access of regular memory of the memory array.

25. A system for providing row redundancy for BISR of a memory array, comprising:
   a memory array segregated into a plurality of rows, the memory army including at least one row of redundant memory;
   a bitline for accessing specific rows of the memory array; and
   a decoupler for decoupling the redundant memory from regular memory of the memory array during accessing of the at least one row of redundant memory for decreasing capacitance of the bitline at least during accessing of the at least one row of redundant memory,
      wherein reducing the capacitance of the bitline reduces the amount of time required to access the at least one row of redundant memory.

26. A method for providing row redundancy for BISR of a memory array, comprising:
   accessing a memory array segregated into a plurality of rows, the memory array including at least one row of redundant memory and a bitline for accessing specific rows of the memory array; and
   decoupling the at least one row of redundant memory from regular memory of the memory array during accessing of the at least one row of redundant memory for decreasing capacitance of the bitline at least during accessing of the at least one row of redundant memory,
      wherein reducing the capacitance of the bitline reduces the amount of time required to access the at least one row of redundant memory.

27. The method as claimed in claim 26, wherein the at least one row of redundant memory is decoupled from regular memory of the memory array when an address of the at least one row of redundant memory is activated.

28. The method as claimed in claim 26, further comprising decoupling the at least one row of redundant memory from an input/output controller of the memory array.

29. The method as claimed in claim 28, wherein the at least one row of redundant memory is decoupled from regular memory of the memory array and from the input/output controller of the memory array when an address of the at least one row of redundant memory is activated.

* * * * *